United States Patent [19]

Sillner

[11] Patent Number: 4,724,954

[45] Date of Patent: Feb. 16, 1988

[54] SYSTEM FOR CONVEYING AND GUIDING COMPONENTS, IN PARTICULAR ELECTRICAL CONSTRUCTION ELEMENTS, WHICH ARE HELD ON A BELT IN A RADIALLY OR QUASI-RADIALLY BELTED MANNER

[76] Inventor: Georg Sillner, Buchenstrasse 23, 8411 Zeitlarn, Fed. Rep. of Germany

[21] Appl. No.: 908,570

[22] Filed: Sep. 18, 1986

[30] Foreign Application Priority Data

Oct. 17, 1985 [DE] Fed. Rep. of Germany ....... 3537010

[51] Int. Cl.⁴ ............................................. B65G 15/60
[52] U.S. Cl. ................................... 198/841; 206/330; 226/196; 53/591; 156/558
[58] Field of Search ................ 226/196; 206/330, 331; 53/591; 198/841, 624, 466.1, 678, 685; 29/759; 156/552, 558, 562

[56] References Cited

U.S. PATENT DOCUMENTS 4,248,151  2/1981  Real ............................... 226/196 X
4,629,178  12/1986  Waddell et al. ................ 226/196 X

FOREIGN PATENT DOCUMENTS 3115506  1/1982  Fed. Rep. of Germany ........ 53/591

Primary Examiner—Joseph E. Valenza
Assistant Examiner—Jonathan D. Holmes
Attorney, Agent, or Firm—Lucas & Just

[57] ABSTRACT

The system is for conveying and guiding electrical construction elements such as resistors and capacitors on a conveyor belt while maintaining the orientation of the electrical construction element. The system employs a belt having tabs that extend outwardly from the plane of the belt. Under the tab is a perforated opening. Wheels or discs are used to move the belt. These wheels or discs have a plurality of projections or pins which engage in the perforated opening of the belt.

12 Claims, 9 Drawing Figures

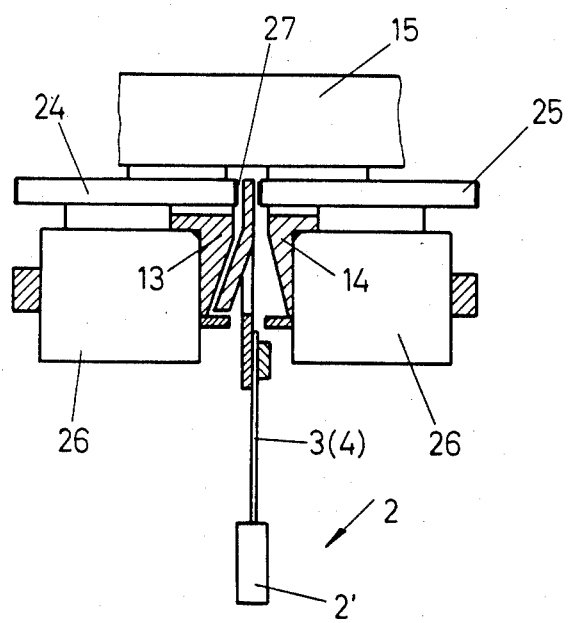
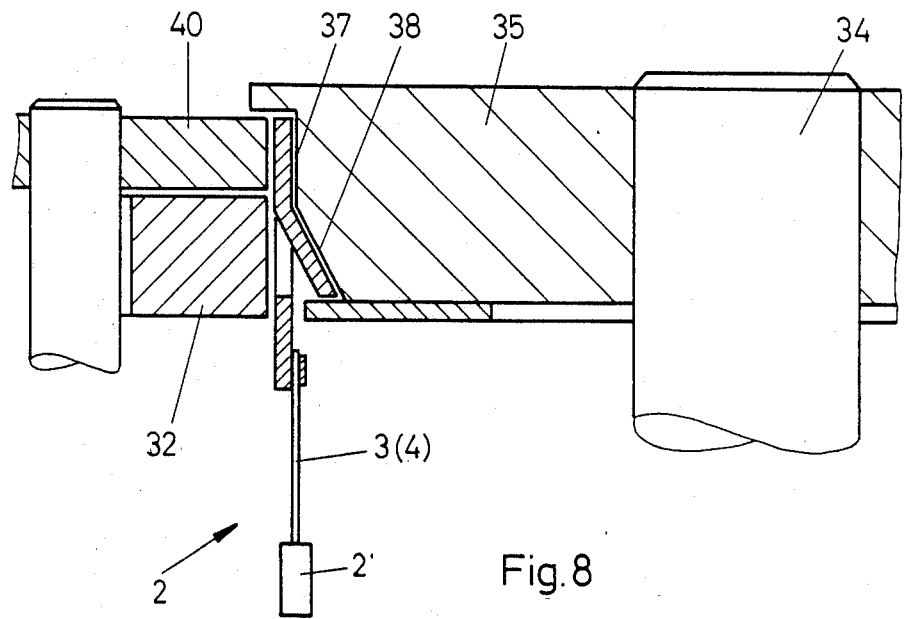

SYSTEM FOR CONVEYING AND GUIDING COMPONENTS, IN PARTICULAR ELECTRICAL CONSTRUCTION ELEMENTS, WHICH ARE HELD ON A BELT IN A RADIALLY OR QUASI-RADIALLY BELTED MANNER

The invention relates to a system for conveying and guiding components, in particular electrical construction elements along a guide, the components being held in a radially or quasi-radially belted manner on a belt with a perforation, which is formed by a plurality of perforated openings produced in the belt by punching or cutting.

It is generally customary to secure construction elements, in particular electrical constuction elements, such as for example resistors, capacitors etc. in a radially or quasi-radially belted manner on a belt provided with a perforation at uniform distances in each case in the longitudinal direction of the belt, in order to be able to convey the components belted in this way with an orientation determined by the belting in each case for treatment or processing inside an apparatus or plant. Conveying is carried out by means of conveying elements, preferably conveying wheels or discs which are provided on their outer periphery with a plurality of projections or pins which engage in the completely punched-out perforated openings of the belt. The pins of the conveying elements engaging in the perforated openings are also used at the same time guiding the belt at the precise position.

The known systems have the particular disadvantage, however, that the belt which supports the components and which is on hand for example in a magazine of an apparatus is necessarily only of a limited length which is determined for example by the fitting ability of the magazine, i.e. during the treatment or processing of the construction elements (for example when applying a covering of insulating material onto the body of the construction element or when bringing the construction elements to the insertion station of an automatic assembly apparatus, for example for assembling electrical circuits or printed circuit boards) the rear end of a belt—as viewed in the direction of movement of the belt—must have the front end (beginning) of a new belt joined to it from time to time, namely in such a way that even in the region of the join the distance between the perforated holes is equal to the distance between these perforated holes otherwise in the longitudinal direction of the belt. This means that the beginning of a new belt must be joined or fastened very precisely, for example by adhesion, e.g. with the aid of an adhesive tape etc., to the end of a belt undergoing the operating process, in order to avoid threading the belt into the treatment or processing device from the beginning again. This joining of a new belt generally necessitates an interruption of the operating process. The same situation occurs when the belt undergoing the operating process is torn by defective operation of the apparatus or by errors in control etc.

The object of the invention is to disclose a system by means of which it is possible to supply belts continuously in succession to an operating process without it being necessary to join the individual belts by connecting them, and without it also being necessary in particular, when joining a belt to the end of a belt undergoing the operating process, to take care that in the region of the join the distance between the perforated openings corresponds exactly to the distance otherwise between these openings along the belt.

In order to attain this object a system is characterized in that the perforated openings are produced in each case by an incomplete cutting line and thus the belt comprises a tab formed by the cutting line in the region of each perforated opening, each tab is pressed outwards from the plane of the belt in such a way that it projects laterally with its free end beyond one surface side of the belt, and the free ends of the tabs form abutment surfaces which bear against at least one guide surface of the guide extending transversely or perpendicularly to the plane of the belt and in the longitudinal direction of the belt.

The system according to the invention has first of all the advantage that the belts for the components can also be used even in those devices which comprise conveying elements with pins engaging in the perforation of the belt for conveying and positioning the belt in a particularly precise manner.

The system according to the invention has the further advantage that with their free ends the tabs provided on the belt form guide surfaces for the belt in the guide or guides used, so that above all it is possible to join the beginning of a new belt to the end of a belt undergoing the operating process on account of the fact that the beginning of the new belt is merely inserted sufficiently far into a guide for the belt to be caught by a conveying device and automatically passed on. The precise joining and also in particular the adhesion of the end of one belt to the beginning of a new belt is unnecessary with the system according to the invention. The belts can therefore be conveyed in succession without interrupting the operating process.

In a preferred embodiment the tabs lying with their longitudinal extension or their face respectively at an angle to the plane or the surface sides of the belt are formed by an appropriate choice of the cutting line in such a way that the free ends of these tabs in each case face a longitudinal edge of the belt. In this way a particularly secure and reliable guide for the belt is attained, since for example possible traction forces acting outwards perpendicularly to this longitudinal edge of the belt (from this longitudinal edge) are securely and reliably absorbed by the tabs engaging behind the—at least one—guide surface of the guide in the manner of barbs, it not being possible for the tabs to be bent by the aforesaid forces so far to the side that they disengage with the—at least one—guide surface, since the guide also at the same time forms a lateral bearing the tabs which prevents the latter from giving way.

The system according to the invention can be used everywhere componentssecured—to a belt—for treatment and processing must be conveyed together with the belt in the longitudinal direction of the said belt. One example of application for the system according to the invention is provided for example when applying a covering of insulating material to the bodies of electrical construction elements. In this connexion the construction elements hanging down from the belt are conveyed together with the belt obliquely upwards for example by way of a first straight guide to a semicircular guiding and conveying portion, below which is preferably disposed a rotating container constructed in the form of an annular trough for the material forming the covering. When passing the curved guiding and conveying portion the construction elements are immersed with their bodies at first to an increasing extent in the material forming the covering and are then lifted out of this material again. The end of the guiding and conveying portion is then followed for example by a second straight guide in which the belt together with the construction elements held on the said belt is taken away obliquely upwards and is conveyed to a further treatment process, for example for drying or hardening the material forming the covering and/or for applying a further layer of insulating material.

Further developments of the invention are characterized by one or more of the following aspects:

the cutting lines of the perforated openings are each formed in such a way that the free end of the tabs are each turned towards a longitudinal edge of the belt;

the free ends of the tabs are each turned towards that longitudinal edge of the belt beyond which the radially or quasi-radially belted components project laterally;

the belt with the components hanging downwards from the said belt is guided in the guide;

the guide comprises a guide channel for receiving the belt, and the tabs are arranged in the interior of the guide channel and they engage behind at least one guide surface in the manner of barbs;

the guide channel has a first portion whose width is approximately equal to or larger than the thickness of the belt, and a second portion which adjoins the first portion and in which the guide channel is made enlarged by a recess on at least one side extending in the longitudinal direction of the belt or in the longitudinal direction of the guide channel, and the guide surface for the free ends of the tabs is formed at the point of transition between the first and the second portion and/or the side of the second portion remote from the first portion;

the tabs lie with their longitudinal extension at an angle to the surface sides or the plane of the belt, and the second portion of the guide channel has, in a cross-sectional plane extending perpendicularly to the longitudinal extension of the belt or the longitudinal extension of the guide, a cross-section whose width increases preferably in a wedge-like manner relative to the guide surface, of which there is at least one;

at least one conveying device for the belt in the region of the guide;

the conveying device comprises at least one conveying element which is driven in a rotating manner and which forms a rotating bearing surface for the belt and by means of the said bearing surface defines a conveying or transporting gap on one side, through which gap the belt is guided;

the rotating conveying element comprises at least one roller or disc, and preferably two rollers or discs which rotate in opposite directions and between which the conveying gap is formed;

the rotating conveying element is a conveying plate whose peripheral surface with a guiding curve partially embracing the conveying plate forms the guide channel which acts at the same time as the transporting or conveying gap; and in addition to the rotating conveying element there is provided at least one pressure roller or disc which presses the belt against the conveying element.

The invention is explained in greater detail below with reference to embodiments in conjunction with the Figures, in which FIG. 1 is a side view of a belt of the system according to the invention together with the construction elements secured to the said belt and belted in a quasi-radial manner;

FIG. 5 is a section corresponding to the line V—V in FIG. 4;

FIG. 8 is a section corresponding to the line VIII—VIII in FIG. 6;

Figure 1:
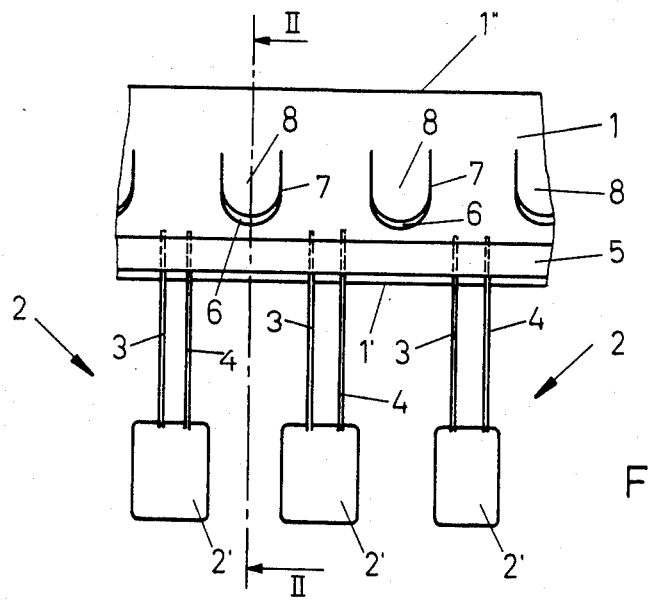

In the Figures, reference numeral 1 designates a belt which is formed in a manner known per se by a strip-shaped blank of reinforced paper or other suitable flat material. Likewise in a manner known per se electrical construction elements 2 are held by the ends of their leads 3 and 4 at uniform distances from one another in each case in such a way that the leads 3 and 4 of all the construction elements 2 lie perpendicular to the longitudinal extension of the belt 1 and the leads 3 and 4 together with the bodies 2' of the construction elements project beyond a common longitudinal side, i.e. in the case of the view selected for FIG. 1 beyond the lower longitudinal side 1' of the belt 1. The construction elements 2 are thus held on the belt in a quasi-radial manner, namely on account of the fact that the ends of the leads 3 and 4 which are at the top in FIG. 1 and which bear on a surface side of the belt 1 are secured there by a continuous adhesive tape 5 or in another suitable manner.

Every two construction elements 2 have provided between them a perforated opening 6 which together with the other, similarly formed perforated openings 6 forms a perforation which extends in the longitudinal direction of the belt and by means of which it is possible, for example when using conveying wheels with pins engaging in this perforation, to convey the belt 1 particularly precisely to an operating station e.g. for processing the construction elements 2, for example of an assembly station etc.

In contrast to the conventional perforated openings, which are completely punched out, each perforated opening 6 of the belt 1 is produced in such a way that with the aid of an appropriate punching tool a cutting line 7 is formed which is incomplete, i.e. in the case of the embodiment illustrated a U-shaped cutting line 7, namely in such a way that the incomplete area of the said cutting line is closer to the longitudinal edge 1" remote from the construction elements 2, i.e. in the case of the view selected for FIG. 1 the upper longitudinal edge 1" of the belt 1 than to the longitudinal edge 1'. On account of the incompletely closed cutting line 7, when punching out each perforated hole 6 a tab 8 is produced which is integral with the belt 1 and the free end 9 of which faces the longitudinal edge 1' and which during the punching or formation of the cutting line 7 is simultaneously pressed outwards to the extent that the tabs 8 of all the perforated openings 6 lie at an angle to the surface sides of the belt 1 and at least with their free ends 9 project at least slightly beyond a common surface side, i.e. in the case of the view selected for FIG. 2 beyond the left-hand surface side of the belt 1.

The tabs 8 provide the possibility of guiding the belt 1—in particular with construction elements 2 hanging down from this belt—in a guiding and conveying element and moving it in the longitudinal direction thereof, in order for example to bring the construction elements 2 forward to specific treatment or processing procedures, without conveying elements which engage in the perforation of the belt 1, e.g. conveying wheels with pins which engage in the belt perforations, being necessary for holding and advancing the belt. On account of the perforated openings 6, the belt 1 is also suitable for using conveying elements which engage in the perforation.

A guiding and conveying element, which allows the belt 1 to be guided and conveyed in the longitudinal direction of the belt while making use of the tabs 8, as illustrated in FIGS. 2 to 5. This rectilinearly designed guiding and conveying element 10 comprises at least one straight guide 11 and at least one conveying or transporting device 12 arranged at the end of the said guide, it being possible for one conveying device 12 to be arranged in each case at the beginning and at the end of the guide 11 and/or for a plurality of guides 11—where necessary with interposed conveying devices 12—to follow in succession, depending upon requirements. In principle it is also possible for the guide 11 to be made not only straight, but also at least on a partial length optionally curved.

Figure 2:
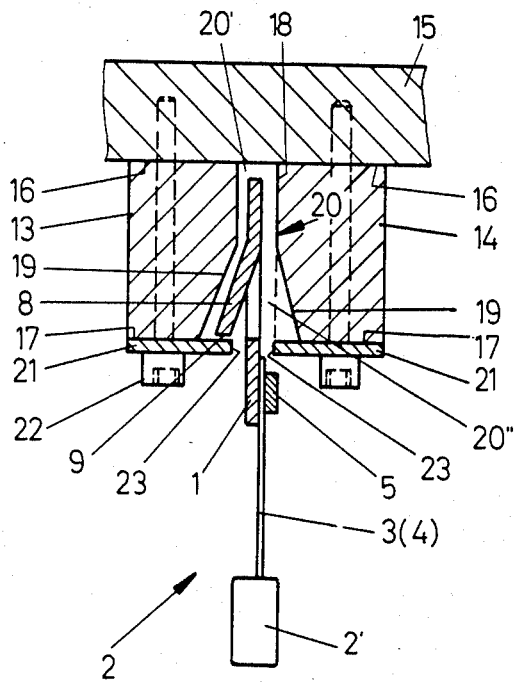
FIG. 2 is a cross-section through the belt along the line II—II in FIG. 1 and through a guiding and conveying element.
Figure 3:
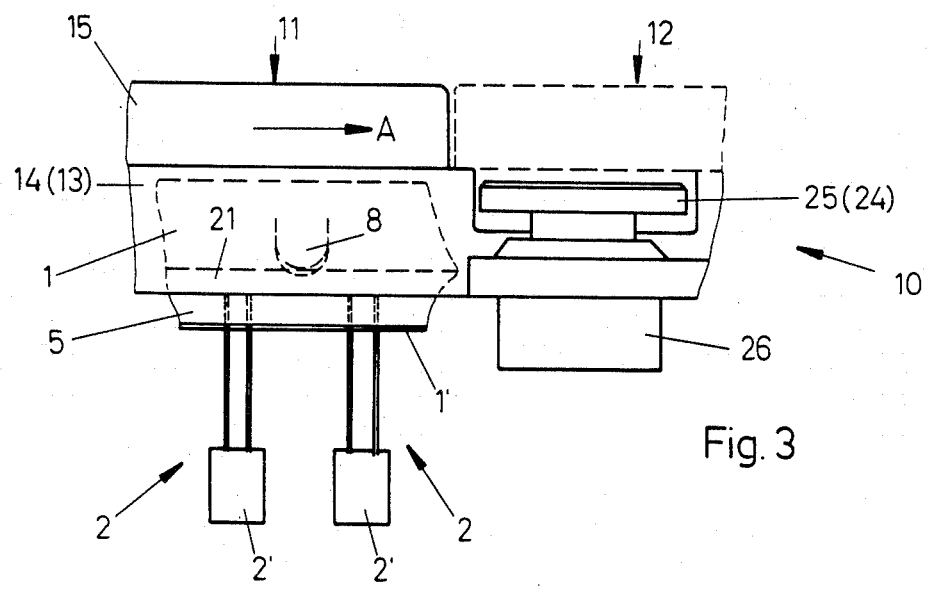
FIG. 3 shows a partial length of the guiding and conveying element of FIG. 2, together with a partial length of the belt guided in the said element and of a conveying device used for passing the belt formed.
Figure 4:
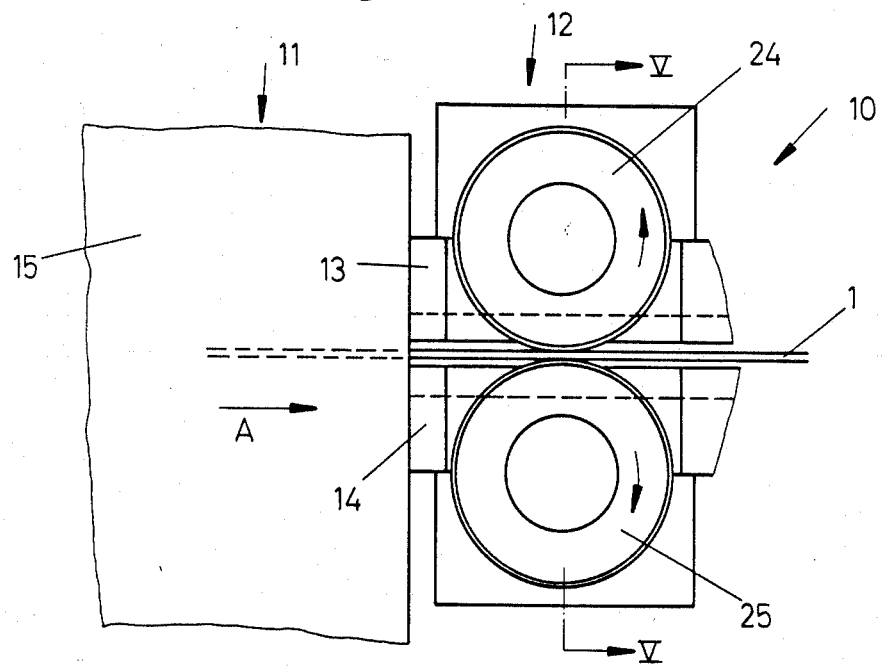
FIG. 4 is a plan view of a partial length of the guiding and conveying element in the region of the conveying device.

Irrespective of whether the guide 11 is made straight or curved at least on a partial length, this guide comprises two guide strips 13 and 14 which are disposed parallel to one another and which are secured to the underside of a holding plate 15. As shown in FIG. 2, the guide strips 13 and 14 have a cross-section such that they each have an upper horizontal surface 16 bearing against the underside of the holding plate 15, a lower, likewise horizontal surface 17 parallel to the surface 16, and at their sides facing one another a surface which comprises in each case an upper, vertical surface portion 18 extending perpendicularly to the surface 16 and a surface portion 19 extending at an angle and adjoining the surface portion 18 at the bottom.

The two guide strips 13 and 14 are secured to the underside of the holding plate 15 at a distance from one another such that they form between themselves a guide channel 20 for the belt 1, the said guide channel 20 being closed at the top by the holding plate 15 and comprising a top portion 20' which directly adjoins the holding plate 15 and which is laterally bounded by the surface portions 18 of the two guide strips 13 and 14 made mirror-symmetrical in cross-section with respect to the vertical median plane of the guide channel 20 and the width of which [top portion 20'] is somewhat greater in horizontal direction and in the direction perpendicular to the longitudinal extension of the belt 1 than the thickness of the belt. The portion 20' is joined at the bottom by a portion 20" in which the width of the guide duct 20 increases downwards in the manner of a wedge on account of the two sloping surface portions 19. The transition between the surface portions 18 and 19 is located approximately where the open part of the cutting line 7, i.e. the foot of the tabs 8 of the perforated openings 6, is situated in the case of the belt inserted in the guide 11, the inclination of the surface portions 19 relative to the surface portions 18 corresponding approximately to the inclination of the tabs 8 relative to the surface sides of the belt 1. The under surfaces 17 of the guide strips 13 and 14 have secured to them in each case a strip-shaped guide rail 21 consisting of flat material and having the top abutting against the surface 17, namely with the aid of screws 22 which are also used at the same time for securing the guide strips 13 and 14 to the holding plate 15. On their longitudinal edges 23, which face one another and extend parallel to one another and are orientated in the longitudinal direction of the guide, the two guide rails 21 have a spacing between one another which is approximately equal to or slightly greater than the thickness of the belt 1, so that an additional guiding gap for the belt 1 is formed between the said longitudinal edges 23. As shown in FIG. 2, one guide rail 21 forms with its top in the region of the longitudinal edges 23 an abutment surface for the free end 9 of the tabs 8 of the belt 1, which is held in this way in the guide 11 and can be displaced along the said guide rail 21 by the tabs 8 sliding on the top of this guide rail 21. With the portion disposed below the perforated openings the belt 1 extends through the slot-shaped opening (guiding gap) formed by the two longitudinal edges 23, so that in particular even the construction elements 2 below the guide 11 are held hanging freely accessible on the belt 1. The symmetrical cross-sectional design of the guide strips 13 and 14 and the use of two guide rails 21 has the advantage that even belts 1, whose tabs 8 differ from the illustration of FIG. 2 by projecting beyond the right-hand surface side of the belt 1 as viewed in this Figure, can be guided in the guide 11.

The conveying device 12, which is essentially formed by two rollers or discs 24 and 25 which are provided at least on their peripheral surface with a friction coating of resilient material and are mounted so as to be rotatable about vertical shafts, is used to move the belt 1 along the guide 11 (arrow A). At least one disc is driven in a rotating manner about the vertical shaft by a drive 26. The two discs 24 and 25 each have a height which is equal to or slightly smaller than the distance between the longitudinal edge 1" and the foot of the tabs 8. In addition, the discs 24 and 25 are arranged in such a way that they form between themselves a conveying gap 27 which follows on the portion 20' of the guide channel 20 of the preceding guide 11 in the conveying direction (arrow A), i.e. the belt 1 passed through the conveying gap 27 is engaged by the discs 24 and 25 only in the region of its upper longitudinal edge 1" above the perforated openings 6, so that in particular even the tabs 8 pressed outwards are kept for a further guidance of the belt 1 after passing the conveying device 12. A guidance for the belt 1 in accordance with the design according to FIG. 2 is also of course provided in the region of the conveying device 12, only the upper surface portions 18 or this part of the corresponding guide elements being recessed for the discs 24 and 25.

The conveying or movement of the belt 1 can also be effected in a different way, for example by the discs 24 and 25 being replaced by conveyor belts which circulate in opposite directions and which with two lengths extending parallel to one another and arranged at a distance from one another form the conveying gap 27 between themselves, or by the guide 11 being a constituent part of a linear vibration conveyor.

Figure 6:
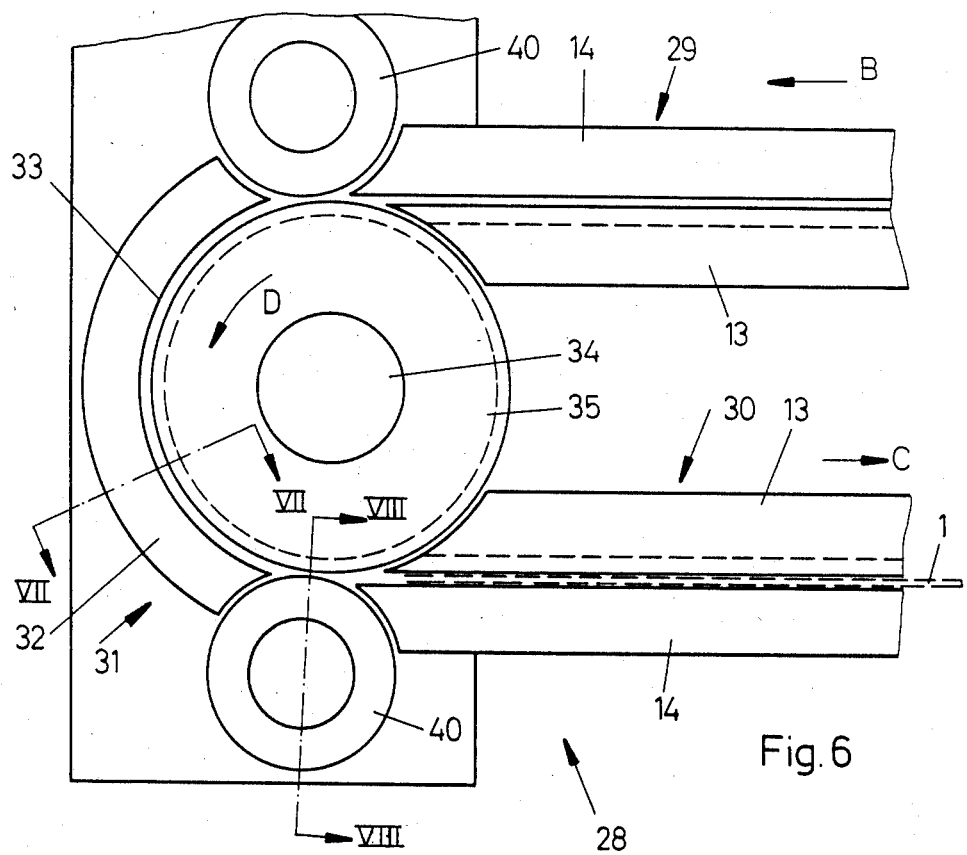
FIG. 6 is a plan view of a further embodiment of the guiding and conveying element.
Figure 7:
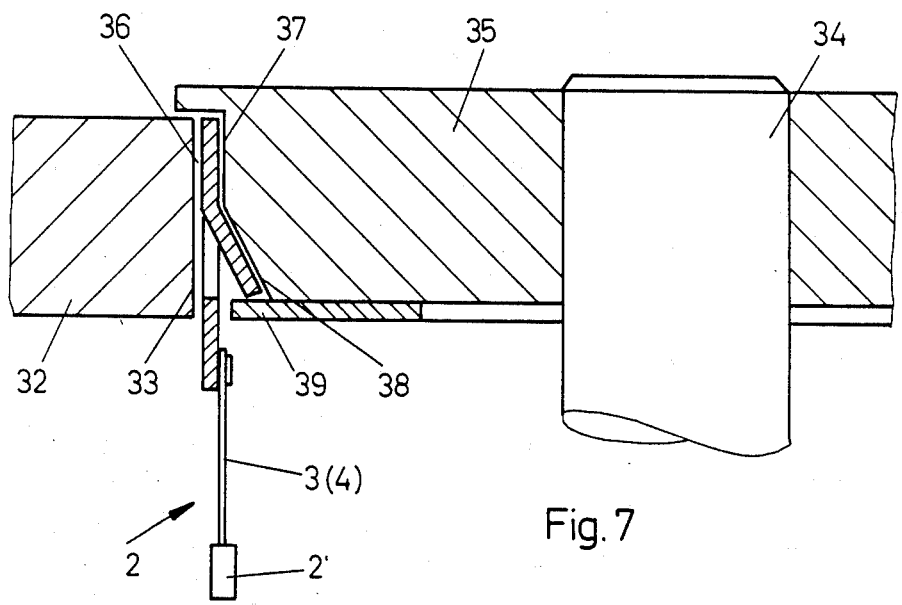
FIG. 7 is a section corresponding to the line VII—VII in FIG. 6.

A further design of the guiding and conveying design is illustrated in FIGS. 6-8. This guiding and conveying device 28 is designed in such a way that the belt 1 with the construction elements 2 again hanging down from the lower longitudinal edge 1' is conveyed to the right-hand end of the device—at the top as viewed in FIG. 6—in the direction of the arrow B and leaves this device again at the right-hand end—at the bottom as viewed in FIG. 6—in the direction of the arrow C, i.e. the belt 1 is turned round in the device 28.

Figure 9:
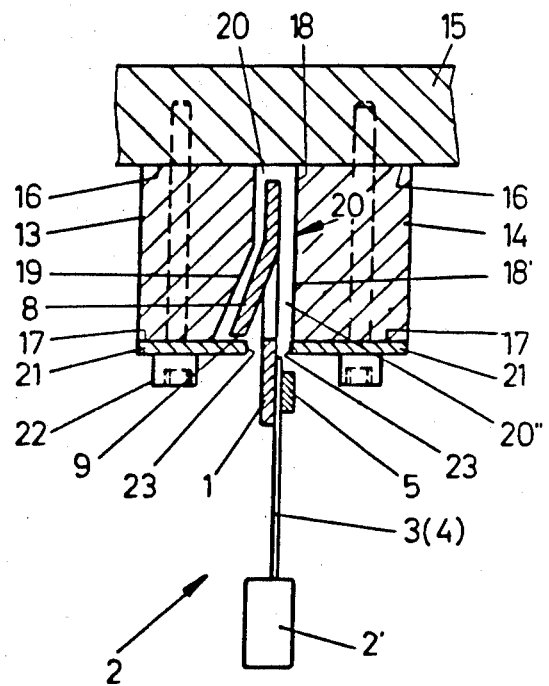
FIG. 9 is a cross-section through the belt along the line II—II in FIG. 1 and is a modified form of the embodiment shown in FIG. 2.

At both its inlet and its outlet the device 28 comprises in each case a straight guide 29 and 30 respectively, which corresponds in its design to the guide 11, but with the difference that only the guide strips 13 disposed on the two mutually facing longitudinal sides of the guides 29 and 30 have the sloping surface portions 19, while the guide strips 14 disposed on the two remote longitudinal sides of the guides 29 and 30 do not have the sloping surface portions 19, but there the vertical surface portion 18 extends from the top 16 to the underside 17 of the guide strips 14, as shown by the broken line 18' in FIG. 9. The two guides 29 and 30 are connected to one another by way of a semicircular guide 31 with a conveying device, the two outer guide strips 14 or their guide surfaces 18' respectively passing in each case into one end of a guide strip 32 formed as a guiding curve or its inner arcuate guide surface 33 respectively. The guide strip 32 formed as a guiding curve embraces a conveying plate driven in a rotating manner about the shaft 34 in the direction of the arrow D in such a way that a guiding and conveying gap 36 for the belt 1 is formed between the guide surface 33 and the peripheral surface of the conveying plate 35.

On account of the fact that the peripheral surface of the conveying plate is made cylindrical in the upper region, i.e. concentric to the shaft 34 and the guide surface 33 and frustoconical in an area adjoining it at the bottom with a cross-section increasingly diminished towards the underside of the conveying plate and in addition the underside of the conveying plate has secured to it a disc or a ring 30 which with its edge lying radially outwards is the same distance from the shaft 34 as is the area 37, a guiding and conveying gap 36 is produced, whose cross-section corresponds to the cross-section of the guide channel in the guides 29 and 30 and in which the belt 1 is held by the tabs 8 supported on the top of the ring 39. The peripheral surface of the conveying plate 35 is preferably produced from a material with a high coefficient of friction.

Two pressure rollers 40 are mounted at the transition between the guides 29 and 30 and the guide 31 so as to be rotatable about vertical axes. The pressure rollers 14 have such a height and are mounted in such a way that like the discs 24 and 25 they act only on the upper region of the belt 1 between the upper longitudinal edge 1" and the feet or bases of the tabs 8. It is to be understood that, as the conveying plate 35 rotates in the direction of the arrow D, the belt inserted by the front end into the guide 29 (for example by hand) is engaged by the conveying plate 35 and is then continuously drawn in at the inlet of the guide 29 and ejected at the outlet of the guide 30.

The invention has been described above with reference to examples of embodiment. It is to be understood that both alterations and modifications are possible without departing from the inventive concept underlying the invention.

I claim:

1. A system for conveying and guiding components, in particular electrical construction elements along a guide, the components being held in a radially or quasi-radially belted manner on a belt with a perforation, which is formed by a plurality of perforated openings produced in the belt by punching or cutting, characterized in that the perforated openings (6) are produced in each case by an incomplete cutting line (7) and thus the belt (1) comprises a tab (8) formed by the cutting line (7) in the region of each perforated opening (6), each tab (8) is pressed outwards from the plane of the belt (1) in such a way that it projects laterally with its free end (9) beyond one surface side of the belt (1), and the free ends (9) of the tabs (8) form abutment surfaces which bear against at least one guide surface (21, 39) of the guide (11, 29, 30, 31) extending transversely or perpendicularly to the plane of the belt and in the longitudinal direction of the belt.

2. A system according to claim 1, characterized in that the cutting lines (7) for the perforated openings (6) are each formed in such a way that the free ends (9) of the tabs (8) are each turned towards a longitudinal edge (1', 1") of the belt (1).

3. A system according to claim 2, characterized in that the free ends (9) of the tabs 8 are each turned towards that longitudinal edge (1') of the belt (1) beyond which the radially or quasi-radially belted components (2) project laterally.

4. A system according to claim 3, characterized in that the belt (1) with the components (2) hanging downwards from the said belt is guided in the guide (11, 29, 30, 31).

5. A system according to claim 1, characterized in that the guide (11, 29, 30, 31) comprises a guide channel (20, 36) for receiving the belt (1), and the tabs (8) are arranged in the interior of the guide channel (20, 36) and they engage behind at least one guide surface (21, 39) in the manner of barbs.

6. A system according to claim 5, characterized in that the guide channel (20, 36) has a first portion whose width is approximately equal to or larger than the thickness of the belt (1), and a second portion (20") which adjoins the first portion (20') and in which the guide channel is made enlarged by a recess on at least one side extending in the longitudinal direction of the belt and in the longitudinal direction of the guide channel, and the guide surface (21, 39) for the free ends (9) of the tabs (8) is formed on the side of the second portion (20") remote from the first portion (20').

7. A system according to claim 6, characterized in that the tabs (8) lie with their longitudinal extension at an angle to the surface sides or the plane of the belt (1), and the second portion (20") of the guide channel (20, 36) has, in a cross-sectional plane extending perpendicularly to the longitudinal extension of the belt (1) and the longitudinal extension of the guide, a cross-section whose width increases preferably in a wedge-like manner relative to the guide surface, of which there is at least one.

8. A system according to claim 1, characterized by at least one conveying device (12, 31) for the belt (1) in the region of the guide.

9. A system according to claim 8, characterized in that the conveying device 12, 31) comprises at least one conveying element (24, 25; 35, 40) which is driven in a rotating manner and which forms a rotating bearing surface for the belt (1) and by means of the said bearing surface defines a conveying or transporting gap (27, 36) on one side, through which gap the belt (1) is guided.

10. A system according to claim 9, characterized in that the rotating conveying element comprises at least one roller or disc (24, 25), and preferably two rollers or discs (24, 25) which rotate in opposite directions and between which the conveying gap is formed.

11. A system according to claim 9, characterized in that the rotating conveying element is a conveying plate (35) whose peripheral surface with a guiding curve (32) partially embracing the conveying plate forms the guie channel (36) which acts at the same time as the transporting or conveying gap.

12. A system according to claim 9, characterized in that in addition to the rotating conveying element (35) there is provided at least one pressure roller or disc (40) which presses the belt against the conveying element.

* * * * *